(12) United States Patent
Wei et al.

(10) Patent No.: US 11,221,712 B1
(45) Date of Patent: Jan. 11, 2022

(54) MICROPROCESSOR, ULTRASONIC TOUCH SENSING DEVICE AND METHOD OF CALIBRATING TOUCH SENSING

(71) Applicants: Interface Technology (ChengDu) Co., Ltd., Sichuan (CN); Interface Optoelectronics (ShenZhen) Co., Ltd., Guangdong (CN); General Interface Solution Limited, Miaoli County (TW)

(72) Inventors: Fu-Cheng Wei, Guangdong (CN); Chih-Lin Liao, Guangdong (CN)

(73) Assignees: Interface Technology (ChengDu) Co., Ltd., Sichuan (CN); Interface Optoelectronics (ShenZhen) Co., Ltd., Guangdong (CN); General Interface Solution Limited, Miaoli County (TW)

(*) Notice: Subject to any disclaimer, the term of this patent is extended or adjusted under 35 U.S.C. 154(b) by 0 days.

(21) Appl. No.: 17/170,858

(22) Filed: Feb. 8, 2021

(30) Foreign Application Priority Data

Nov. 4, 2020 (CN) .......................... 202011216564.0

(51) Int. Cl.
*G06F 3/041* (2006.01)
*G06F 3/043* (2006.01)
*G01K 3/00* (2006.01)
*G01K 7/16* (2006.01)

(52) U.S. Cl.
CPC ........... *G06F 3/0418* (2013.01); *G01K 3/005* (2013.01); *G01K 7/16* (2013.01); *G06F 3/043* (2013.01)

(58) Field of Classification Search
None
See application file for complete search history.

(56) References Cited

U.S. PATENT DOCUMENTS

2018/0101711 A1* 4/2018 D'Souza .............. G06K 9/0002
2019/0370518 A1* 12/2019 Maor ................... A61B 8/5223

* cited by examiner

*Primary Examiner* — Aneeta Yodichkas
(74) *Attorney, Agent, or Firm* — CKC & Partners Co., LLC

(57) ABSTRACT

A method of calibrating touch sensing applicable to a microprocessor of an ultrasonic touch sensing device, in which the ultrasonic touch sensing device is for generating a touch sensing signal according to a ultrasonic wave, and the method includes: receiving the touch sensing signal; measuring temperature of the ultrasonic touch sensing device to generate multiple temperature parameters; if a variation tendency of the temperature parameters is downward, and if a level of the touch sensing signal lower than a level of a reference signal is first detected, storing the level of the touch sensing signal as a first signal strength and reporting a touch event is detected; and if the variation tendency of the temperature parameters is downward, and if the level of the touch sensing signal lower than the level of the reference signal is not first detected, calibrating the reference signal according to the touch sensing signal.

16 Claims, 7 Drawing Sheets

MICROPROCESSOR, ULTRASONIC TOUCH SENSING DEVICE AND METHOD OF CALIBRATING TOUCH SENSING

RELATED APPLICATION

The present application claims priority to China Application Serial Number 202011216564.0, filed Nov. 4, 2020, which is incorporated herein by reference in its entirety.

BACKGROUND

Technical Field

The present disclosure relates to a microprocessor, an ultrasonic touch sensing device and method of calibrating touch sensing. More particularly, the present disclosure relates to a microprocessor, an ultrasonic touch sensing device and method of calibrating touch sensing include a temperature detecting circuit.

Description of Related Art

In general, ultrasonic touch sensing device includes a piezoelectric sensing layer for generating ultrasonic wave, and a piezoelectric detecting layer for receiving the reflected ultrasonic wave. When a touch event occurs, intensity of the ultrasonic wave detected by the piezoelectric detecting layer begins to decay, and if the intensity of the reflected ultrasonic wave is lower than a preset system reference value, the ultrasonic touch sensing device triggers the system to locate where the touch event occurs.

SUMMARY

One aspect of the present disclosure is to provide a method of calibrating touch sensing applicable to a microprocessor of an ultrasonic touch sensing device, in which the ultrasonic touch sensing device is configured to generate a touch sensing signal according to an ultrasonic wave, and the method includes: receiving the touch sensing signal; measuring temperature of the ultrasonic touch sensing device to generate a plurality of temperature parameters; if the plurality of temperature parameters having a downward variation tendency, and if it is a first time that a level of the touch sensing signal is lower than a level of a reference signal, storing the level of the touch sensing signal as a first signal strength, and reporting a touch event is detected; and if the plurality of temperature parameters having a downward variation tendency, and if it is not the first time that the level of the touch sensing signal is lower than the level of the reference signal, calibrating the reference signal according to the touch sensing signal.

Another aspect of the present disclosure provides an ultrasonic touch sensing device which includes a touch sensor, a temperature detecting circuit and a microprocessor. The touch sensor is configured to generate a touch sensing signal according to an ultrasonic signal. The temperature detecting circuit is configured to generate a temperature detecting signal. The microprocessor coupled to the touch sensor and the temperature detecting circuit, is configured to perform operations below: receiving the touch sensing signal; generating a plurality of temperature parameters according to the temperature detecting signal; if the plurality of temperature parameters having a downward variation tendency, and if it is a first time that a level of the touch sensing signal is lower than a level of a reference signal, storing the level of the touch sensing signal as a first signal strength, and reporting a touch event is detected; and if the plurality of temperature parameters having a downward variation tendency, and if it is not the first time that the level of the touch sensing signal is lower than the level of the reference signal, calibrating the reference signal according to the touch sensing signal.

Another aspect of the present disclosure provides a microprocessor applicable to an ultrasonic touch sensing device, in which the ultrasonic touch sensing device comprises a touch sensor and a temperature detecting circuit both coupled to the microprocessor. The microprocessor is configured to: receive a touch sensing signal from the touch sensor; generate a plurality of temperature parameters according to a temperature detecting signal from the temperature detecting circuit; if the plurality of temperature parameters having a downward variation tendency, and if it is a first time that a level of the touch sensing signal is lower than a level of a reference signal, store the level of the touch sensing signal as a first signal strength, and report a touch event is detected; and if the plurality of temperature parameters having a downward variation tendency, and if it is not the first time that the level of the touch sensing signal is lower than the level of the reference signal, calibrate the reference signal according to the touch sensing signal.

As described above, the microprocessor, the ultrasonic touch sensing device and method of calibrating touch sensing of the present disclosure may be able to avoid detecting touch event incorrectly by calibrating the ultrasonic touch sensing device according to temperature variances.

It is to be understood that both the foregoing general description and the following detailed description are by examples, and are intended to provide further explanation of the disclosure as claimed.

DETAILED DESCRIPTION

Figure 1:
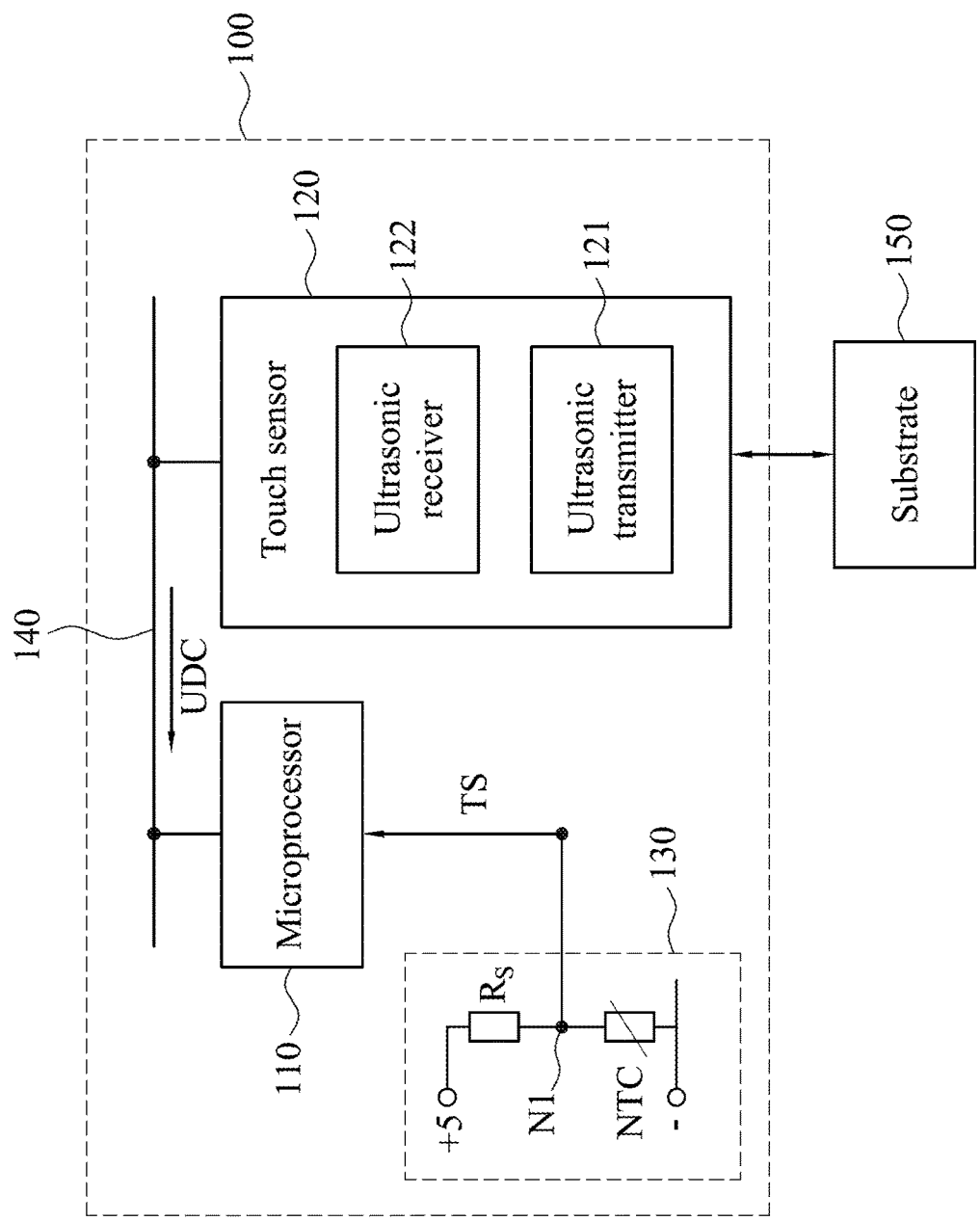
FIG. 1 is a simplified block diagram of an ultrasonic touch sensing device, in accordance with some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

All the terms used in this document generally have their ordinary meanings. The examples of using any terms discussed herein such as those defined in commonly used dictionaries are illustrative only, and should not limit the scope and meaning of the disclosure. Likewise, the present disclosure is not limited to some embodiments given in this document.

FIG. 1 is a simplified block diagram of an ultrasonic touch sensing device 100, in accordance with some embodiments of the present disclosure. As shown in FIG. 1, the ultrasonic touch sensing device 100 includes a microprocessor 110, a touch sensor 120, a temperature detecting circuit 130 and a bus 140. The touch sensor 120 includes an ultrasonic transmitter 121 and an ultrasonic receiver 122. The temperature detecting circuit 130 includes a divider resistor Rs and a thermal resistor NTC.

Structurally, the microprocessor 110 is coupled to the touch sensor 120, and receives a touch sensing signal UDC provided by the touch sensor 120 through the bus 140. The thermal resistor NTC is coupled to the divider resistor Rs through a first node N1. The microprocessor 110 receives a temperature detecting signal TS generated by the temperature detecting circuit 130 through the first node N1.

Figure 2:
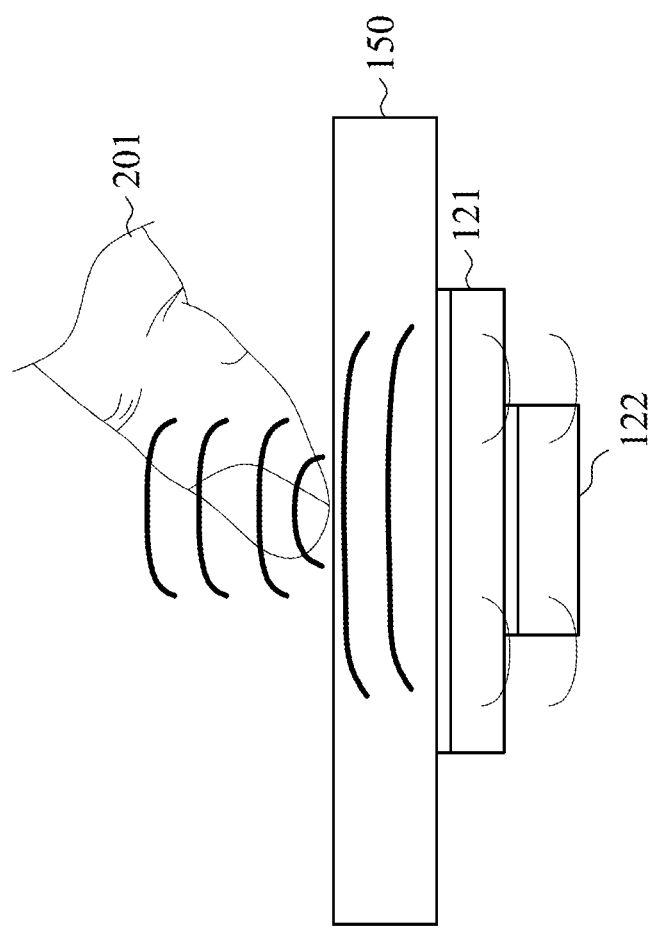
FIG. 2 is a schematic diagram of operating a touch sensor, in accordance with some embodiments of the present disclosure.
Figure 4:
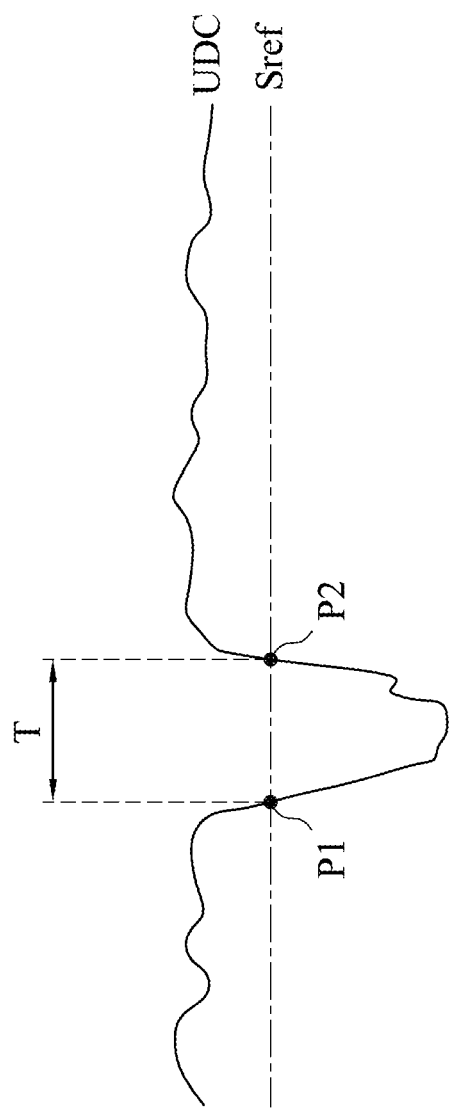
FIG. 4 is a schematic diagram of signal waveforms of the ultrasonic touch sensing device, in accordance with some embodiments of the present disclosure.

FIG. 2 is a schematic diagram of operating the touch sensor 120, in accordance with some embodiments of the present disclosure. In operation, as shown in FIG. 2, the ultrasonic transmitter 121 of the touch sensor 120 generates an ultrasonic wave. The ultrasonic wave is reflected, and then converted to an electrical signal by the ultrasonic receiver 122. The electrical signal is processed into the touch sensing signal UDC (Ultra Sonic Digital Converter) by an integrator (not shown) of the touch sensor 120. In some embodiments, the touch sensing signal UDC is an ultrasonic analog voltage signal converted to digital values by an analog-to-digital converter (ADC) for the subsequent reading and calculation of the microprocessor 110. Generally, when a touch event occurs (i.e., when an object 201 is placed on a substrate 150), intensity of the touch sensing signal UDC received by the microprocessor 110 begins to attenuate from a level of a reference signal Sref (as shown in FIG. 4 later). In other words, when a level of the touch sensing signal UDC is lower than the level of the reference signal Sref, the ultrasonic touch sensing device 100 would detect the touch event.

In some embodiments, the ultrasonic transmitter 121 may be implemented by any piezoelectric materials, and the ultrasonic receiver 122 may be implemented by combinations of piezoelectric materials and sensing pixels. The object 201 may be fingers or stylus.

The microprocessor 110 is configured to generate multiple temperature parameters according to a temperature detecting signal TS. The temperature parameters correspond to ambient temperature in the ultrasonic touch sensing device 100. In some embodiments, the level of the touch sensing signal UDC is positively correlated to the temperature parameters. In other words, when the touch event occurs, if the temperature parameters of the ultrasonic touch sensing device 100 decreases gradually, the level of the touch sensing signal UDC will decrease accordingly. Thus, the level of the touch sensing signal UDC could not go back to the level of the reference signal Sref even when the touch event is ended, which causes the ultrasonic touch sensing device 100 incorrectly detecting the touch event continuously. Therefore, the present disclosure provides a method 300 of calibrating touch sensing to solve the above problem.

Figure 3A:
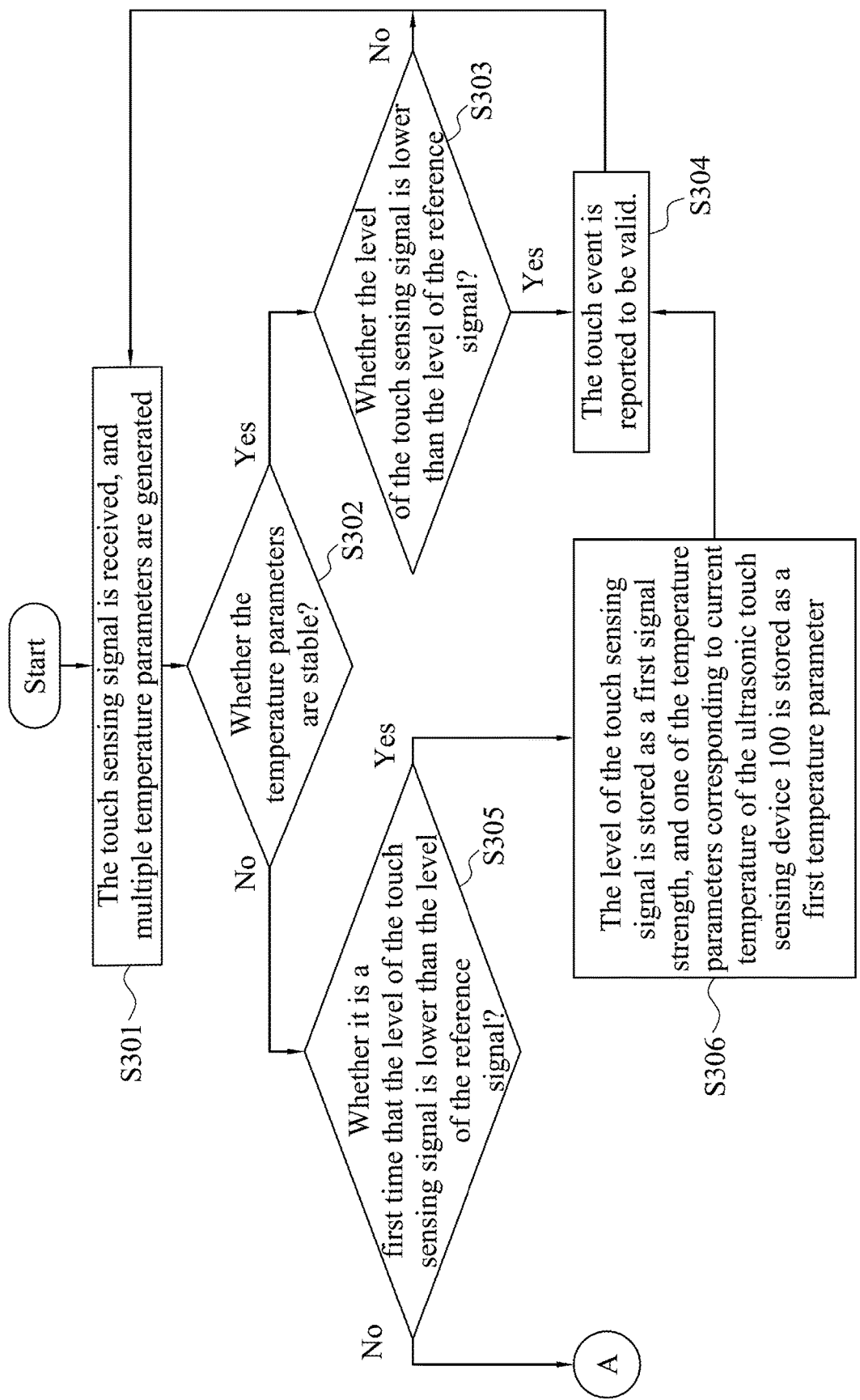
FIG. 3A-3B is a flow chart of method of calibrating touch sensing, in accordance with some embodiments of the present disclosure.
Figure 3B:
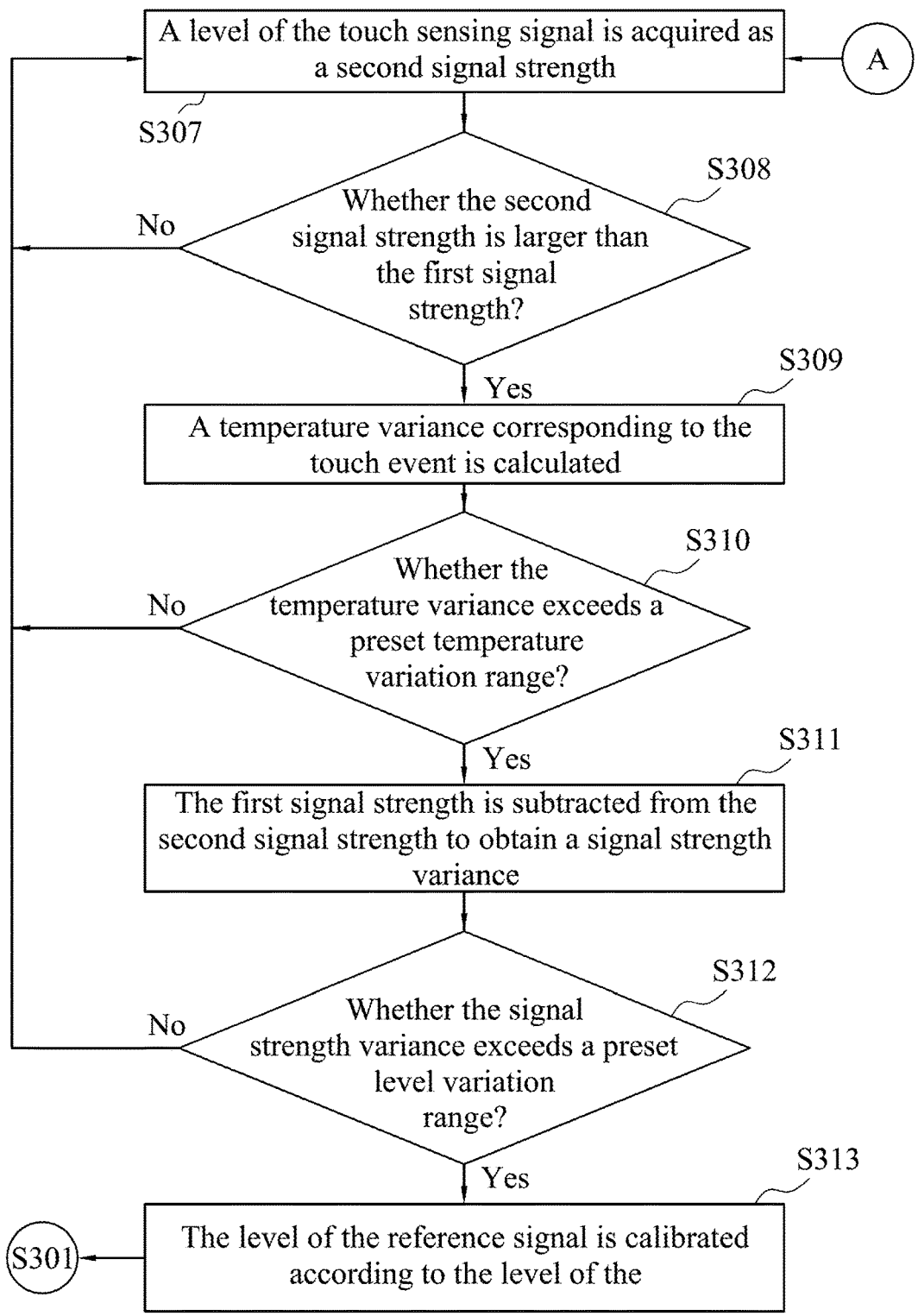
Figure 5:
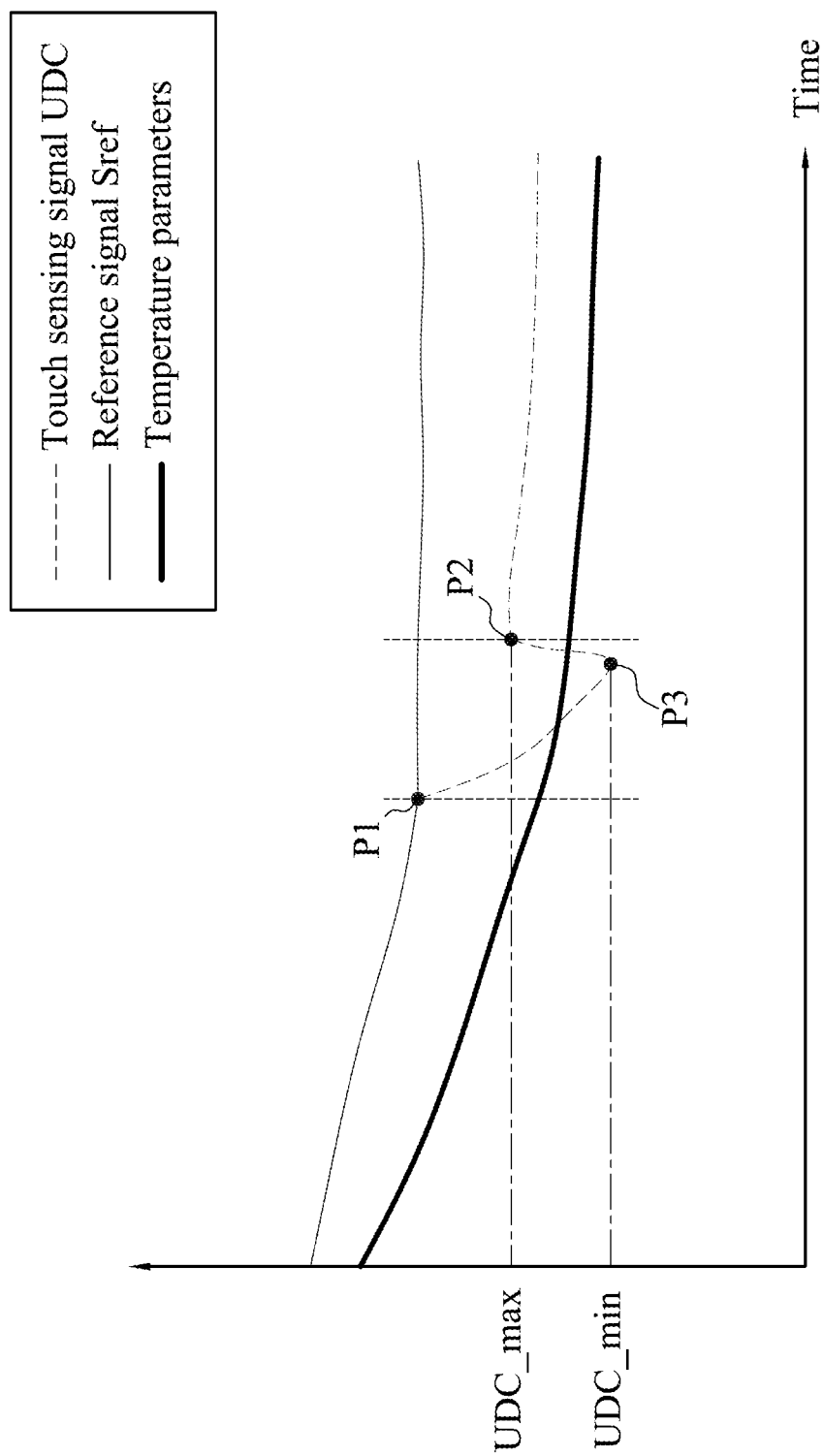
FIG. 5 is a schematic diagram of signal waveforms of the ultrasonic touch sensing device, in accordance with another embodiment of the present disclosure.

FIG. 3A-3B is a flow chart of method 300 of calibrating touch sensing, in accordance with some embodiments of the present disclosure. FIG. 4 is a schematic diagram of signal waveforms of the ultrasonic touch sensing device 100, in accordance with some embodiments of the present disclosure. FIG. 5 is a schematic diagram of signal waveforms of the ultrasonic touch sensing device 100, in accordance with another embodiment of the present disclosure. For the ease and clarity of illustration, the flow chart of FIG. 3A-3B are described in the following paragraphs by referring to the embodiments shown in FIGS. 4-5, but are not limited as such.

In step S301, the microprocessor 110 receive the touch sensing signal UDC, and using the temperature detecting circuit 130 to detect temperature of the ultrasonic touch sensing device 100. In other words, the microprocessor 110 generate multiple temperature parameters related to the ultrasonic touch sensing device 100 using the temperature detecting signal TS.

In step S302, the microprocessor 110 determines whether the temperature parameters mentioned above are stable. If the temperature parameters are stable, the microprocessor 110 proceeds to perform step S303. It should be noted that, in the present disclosure, the temperature parameters being stable represents that variations of the temperature parameters within a preset amount of time are substantially zero.

In step S303, the microprocessor 110 determines whether the level of the touch sensing signal UDC is lower than the level of the reference signal Sref. If the level of the touch sensing signal UDC is lower than the level of the reference signal Sref, the microprocessor 110 performs step S304 so as to report the touch event is valid, and the ultrasonic touch sensing device 100 detects the touch event. The microprocessor 110 may perform step S301 again after performing step S304. However, if the level of the touch sensing signal UDC is not lower than the level of the reference signal Sref, the microprocessor 110 may directly perform step S301 to receive the touch sensing signal UDC, and measure the temperature of the ultrasonic touch sensing device 100 again.

For instance, as shown in FIG. 4, the level of the touch sensing signal UDC at a time point P1 and a time point P2 is lower than the level of the reference signal Sref, i.e., the object 201 touches the substrate 150 at the time point P1, and leaves the substrate 150 at the time point P2. Therefore, in step S304, the microprocessor 110 would report the touch event during a touch event period T is valid.

Following step S302, if the temperature parameters are not stable, i.e., if the temperature parameters have a downward or upward variation tendency, then the microprocessor 110 performs step S305.

In step S305, the microprocessor 110 determines whether it is a first time that the level of the touch sensing signal UDC is lower than the level of the reference signal Sref. If the temperature parameters have a downward variation tendency, and it is the first time that the level of the touch sensing signal UDC is lower than the level of the reference signal Sref (e.g., the touch sensing signal UDC at a time point P3 in FIG. 5), in step S306, the microprocessor 110 stores the level of the touch sensing signal UDC and one of the temperature parameters corresponding to current temperature of the ultrasonic touch sensing device 100, as a first signal strength and a first temperature parameter respectively, and performs step S304 again to report the touch event is valid.

Reference is made to FIG. 5. In some embodiments, at the time point P3, the level of the touch sensing signal UDC decreases to a minimum intensity UDC_min, and the microprocessor 110 stores the minimum intensity UDC_min as a first signal strength.

If it is not the first time that the level of the touch sensing signal UDC is lower than the level of the reference signal Sref (e.g., the touch sensing signal UDC after the time point P3 in FIG. 5), the microprocessor 110 will perform the step S307-S313 in the following paragraphs to calibrate the reference signal Sref according to the touch sensing signal UDC.

In step S307, the microprocessor 110 obtains a current level of the touch sensing signal UDC as a second signal strength. In step S308, the microprocessor 110 determines whether the second signal strength is larger than the first signal strength. If the second signal strength is not larger than the first signal strength, the microprocessor 110 does not calibrate the reference signal Sref, i.e., the microprocessor 110 maintains the level of the reference signal Sref, and performs step S307 again.

If the second signal strength is larger than the first signal strength, the microprocessor 110 calculates a temperature variance corresponding to the touch event in step S309. Then, in step S310, the microprocessor 110 determines whether the temperature variance exceeds a preset temperature variation range. If the temperature variance does not exceed the preset temperature variation range, the microprocessor 110 does not calibrate the reference signal Sref. In other words, the microprocessor 110 maintains the level of the reference signal Sref, and performs step S307 again.

In some embodiments, the temperature variance of the touch event is a difference of the first temperature parameter corresponding to the time point P1 minus the second temperature parameter corresponding to the time point P2.

In step S311, if the temperature variance exceeds the preset temperature variation range, the microprocessor 110 subtracts the first signal strength from the second signal strength to obtain a signal strength variance. Then, in step S312, the microprocessor 110 determines whether the signal strength variance mentioned above exceeds a preset level variation range. If the signal strength variance does not exceed the preset level variation range, then the microprocessor 110 does not calibrate the reference signal Sref. In other words, the microprocessor 110 maintains the level of the reference signal Sref, and performs step S307 again.

In some embodiments, the touch sensing signal UDC reaches maximum intensity UDC_max at the time point P2, and the microprocessor 110 may store the maximum intensity UDC_max as the second signal strength.

Therefore, in step S313, if the maximum intensity UDC_max minus the minimum intensity UDC_min is larger than the preset level variation range, the microprocessor 110 calibrates the level of the reference signal Sref according to the level of the touch sensing signal UDC. Then, the microprocessor 110 will perform step S301 again so as to receive the touch sensing signal UDC, and measure the temperature of the ultrasonic touch sensing device 100 again.

In some embodiments, the microprocessor 110 calibrates the reference signal Sref by adjusting the level of the reference signal Sref to substantially the same as the level of the touch sensing signal UDC, such that the level of the calibrated reference signal Sref is also positively correlated to the temperature parameters.

Figure 6:
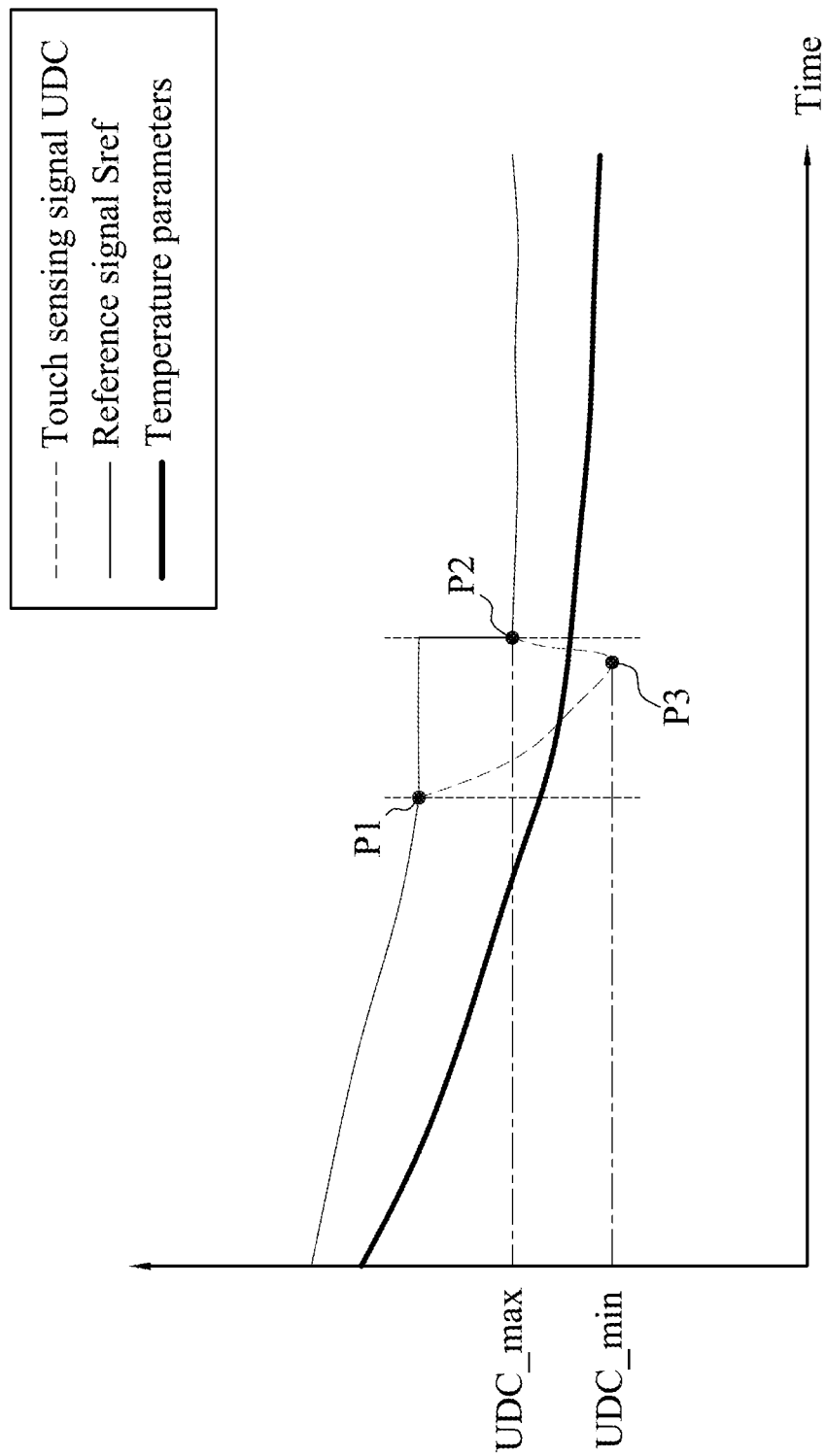
FIG. 6 is a schematic diagram of signal waveforms of the ultrasonic touch sensing device, in accordance with yet another embodiment of the present disclosure.

FIG. 6 is a schematic diagram of signal waveforms of the ultrasonic touch sensing device 100, in accordance with yet another embodiment of the present disclosure. As shown in FIG. 6, by performing the method 300 of calibrating touch sensing, the level of the reference signal Sref at time point P2 is substantially same as the level of the touch sensing signal UDC. Therefore, when the touch event is ended, the level of the touch sensing signal UDC would not be lower than the level of the calibrated reference signal Sref, which prevents the ultrasonic touch sensing device 100 from incorrectly detecting the touch event continuously.

While the disclosure has been described by way of example(s) and in terms of the preferred embodiment(s), it is to be understood that the disclosure is not limited thereto. Those skilled in the art may make various changes, substitutions, and alterations herein without departing from the spirit and scope of the present disclosure. In view of the foregoing, it is intended that the present invention cover modifications and variations of this invention provided they fall within the scope of the following claims.

What is claimed is:

1. A method of calibrating touch sensing applicable to a microprocessor of an ultrasonic touch sensing device, wherein the ultrasonic touch sensing device is configured to generate a touch sensing signal according to an ultrasonic wave, and the method comprising:
   receiving the touch sensing signal;
   measuring temperature of the ultrasonic touch sensing device to generate a plurality of temperature parameters;
   if the plurality of temperature parameters having a downward variation tendency, and if it is a first time that a level of the touch sensing signal is lower than a level of a reference signal, storing the level of the touch sensing signal as a first signal strength, and reporting a touch event is detected; and
   if the plurality of temperature parameters having a downward variation tendency, and if it is not the first time that the level of the touch sensing signal is lower than the level of the reference signal, calibrating the reference signal according to the touch sensing signal.

2. The method of calibrating touch sensing of claim 1, wherein calibrating the reference signal according to the touch sensing signal comprises:
   acquiring a level of the touch sensing signal as a second signal strength;
   calculating a temperature variance corresponding to the touch event according to the plurality of temperature parameters;
   if the temperature variance exceeds a preset temperature variation range, and if the second signal strength is larger than the first signal strength, calibrating the level of the reference signal according to the touch sensing signal; and
   if the temperature variance does not exceed the preset temperature variation range, or if the second signal strength is not larger than the first signal strength, maintaining the level of the reference signal.

3. The method of calibrating touch sensing of claim 2, wherein calibrating the reference signal according to the touch sensing signal further comprises:
   acquiring a signal strength variance by subtracting the first signal strength from the second signal strength;
   wherein when the temperature variance exceeds the preset temperature variation range, and the second signal strength is larger than the first signal strength, if the signal strength variance is larger than a preset level variation range, calibrating the level of the reference signal according to the level of the touch sensing signal; and
   if the signal strength variance is not larger than the preset level variation range, maintaining the level of the reference signal.

4. The method of calibrating touch sensing of claim 3, wherein calibrating the level of the reference signal according to the level of the touch sensing signal comprises:

adjusting the level of the reference signal to substantially the same as the level of the touch sensing signal.

5. The method of calibrating touch sensing of claim 1, wherein the reference signal is positive correlated to the plurality of temperature parameters.

6. An ultrasonic touch sensing device comprising:
a touch sensor configured to generate a touch sensing signal according to an ultrasonic signal;
a temperature detecting circuit configured to generate a temperature detecting signal;
a microprocessor coupled to the touch sensor and the temperature detecting circuit, configured to perform operations below:
receiving the touch sensing signal;
generating a plurality of temperature parameters according to the temperature detecting signal;
if the plurality of temperature parameters having a downward variation tendency, and if it is a first time that a level of the touch sensing signal is lower than a level of a reference signal, storing the level of the touch sensing signal as a first signal strength, and reporting a touch event is detected; and
if the plurality of temperature parameters having a downward variation tendency, and if it is not the first time that the level of the touch sensing signal is lower than the level of the reference signal, calibrating the reference signal according to the touch sensing signal.

7. The ultrasonic touch sensing device of claim 6, wherein the temperature detecting circuit comprises:
a divider resistor; and
a thermal resistor coupled to the divider resistor through a first node, wherein the first node is configured to provide the temperature detecting signal.

8. The ultrasonic touch sensing device of claim 6, wherein the microprocessor performs calibrating the reference signal according to the touch sensing signal comprises:
acquiring a level of the touch sensing signal as a second signal strength;
calculating a temperature variance corresponding to the touch event according to the plurality of temperature parameters;
if the temperature variance exceeds a preset temperature variation range, and if the second signal strength is larger than the first signal strength, calibrating the level of the reference signal according to the touch sensing signal; and
if the temperature variance does not exceed the preset temperature variation range, or if the second signal strength is not larger than the first signal strength, maintaining the level of the reference signal.

9. The ultrasonic touch sensing device of claim 8, wherein the microprocessor performs calibrating the reference signal according to the touch sensing signal further comprises:
acquiring a signal strength variance by subtracting the first signal strength from the second signal strength;
wherein when the temperature variance exceeds the preset temperature variation range, and the second signal strength is larger than the first signal strength, if the signal strength variance is larger than a preset level variation range, calibrating the level of the reference signal according to the level of the touch sensing signal; and
if the signal strength variance is not larger than the preset level variation range, maintaining the level of the reference signal.

10. The ultrasonic touch sensing device of claim 9, wherein the microprocessor performs calibrating the level of the reference signal according to the level of the touch sensing signal comprises:
adjusting the level of the reference signal to substantially the same as the level of the touch sensing signal.

11. The ultrasonic touch sensing device of claim 6, wherein the reference signal is positive correlated to the plurality of temperature parameters.

12. A microprocessor applicable to an ultrasonic touch sensing device, wherein the ultrasonic touch sensing device comprises a touch sensor and a temperature detecting circuit both coupled to the microprocessor, and the microprocessor is configured to:
receive a touch sensing signal from the touch sensor;
generate a plurality of temperature parameters according to a temperature detecting signal from the temperature detecting circuit;
if the plurality of temperature parameters having a downward variation tendency, and if it is a first time that a level of the touch sensing signal is lower than a level of a reference signal, store the level of the touch sensing signal as a first signal strength, and report a touch event is detected; and
if the plurality of temperature parameters having a downward variation tendency, and if it is not the first time that the level of the touch sensing signal is lower than the level of the reference signal, calibrate the reference signal according to the touch sensing signal.

13. The microprocessor of claim 12, wherein the microprocessor calibrates the reference signal according to the touch sensing signal by being configured to:
acquire a level of the touch sensing signal as a second signal strength;
calculate a temperature variance corresponding to the touch event according to the plurality of temperature parameters;
if the temperature variance exceeds a preset temperature variation range, and if the second signal strength is larger than the first signal strength, calibrate the level of the reference signal according to the touch sensing signal; and
if the temperature variance does not exceed the preset temperature variation range, or if the second signal strength is not larger than the first signal strength, maintain the level of the reference signal.

14. The microprocessor of claim 13, wherein the microprocessor calibrates the reference signal according to the touch sensing signal by being further configured to:
acquire a signal strength variance by subtracting the first signal strength from the second signal strength;
wherein when the temperature variance exceeds the preset temperature variation range, and the second signal strength is larger than the first signal strength, if the signal strength variance is larger than a preset level variation range, calibrate the level of the reference signal according to the level of the touch sensing signal; and
if the signal strength variance is not larger than the preset level variation range, maintain the level of the reference signal.

15. The microprocessor of claim 14, wherein the microprocessor calibrates the level of the reference signal according to the level of the touch sensing signal by being configured to:
adjust the level of the reference signal to substantially the same as the level of the touch sensing signal.

16. The microprocessor of claim 12, wherein the reference signal is positive correlated to the plurality of temperature parameters.

\* \* \* \* \*